(12) United States Patent
Chiu

(10) Patent No.: US 6,575,645 B2
(45) Date of Patent: Jun. 10, 2003

(54) METHOD AND APPARATUS FOR IMPROVING RESIST PATTERN DEVELOPING

(75) Inventor: Wei-Kay Chiu, Shin-Chu Hsien (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/067,062

(22) Filed: Feb. 6, 2002

(65) Prior Publication Data
US 2002/0090575 A1 Jul. 11, 2002

Related U.S. Application Data

(62) Division of application No. 08/827,815, filed on Apr. 11, 1997, now Pat. No. 6,355,397.

(51) Int. Cl.$^7$ .............................. G03D 3/04; G03D 3/06
(52) U.S. Cl. .................. 396/571; 396/611; 396/625; 396/626; 396/633; 134/902
(58) Field of Search .................. 396/625, 626, 396/633, 571, 611; 134/902; 430/325

(56) References Cited

U.S. PATENT DOCUMENTS

| | | | | |
|---|---|---|---|---|
| 4,429,983 A | * | 2/1984 | Cortellino et al. | 396/617 |
| 4,633,804 A | * | 1/1987 | Arii | 118/52 |
| 4,902,608 A | | 2/1990 | Lamb et al. | 430/325 |
| 4,982,215 A | | 1/1991 | Matsuoka | 354/299 |
| 5,025,280 A | | 6/1991 | Lamb et al. | 354/299 |
| 5,175,124 A | * | 12/1992 | Winebarger | 438/584 |
| 5,227,001 A | * | 7/1993 | Tamaki et al. | 110/300 |
| 5,368,054 A | * | 11/1994 | Koretsky et al. | 134/153 |
| 5,650,251 A | * | 7/1997 | Ishiwata et al. | 430/7 |
| 5,718,763 A | * | 2/1998 | Tateyama et al. | 118/52 |
| 5,762,708 A | * | 6/1998 | Motoda et al. | 118/52 |
| 5,853,961 A | * | 12/1998 | Sakai et al. | 430/325 |

FOREIGN PATENT DOCUMENTS

JP        9-69488       * 3/1997

* cited by examiner

Primary Examiner—Alan A. Mathews
(74) Attorney, Agent, or Firm—George O. Saile; Stephen B. Ackerman

(57) ABSTRACT

An apparatus and method for developing a selectively exposed resist pattern, on an integrated circuit wafer, which avoids damage to the resist pattern and allows greater freedom in the choice of resists. Developer is placed on a selectively exposed layer of resist for a first time. The layer of resist and developer are then immersed in a cleaning liquid time for a second time to stop the developing action and remove the developer. As an option, ultrasonic power can be delivered to the wafer or the cleaning liquid while the layer of resist is immersed in the cleaning liquid. The cleaning liquid is then removed from the layer of resist, now a resist pattern, and the wafer and resist pattern is placed in a vacuum for drying. As another option, heat can be applied to the wafer and resist pattern while they are in the vacuum. The wafer and resist pattern are then removed from the vacuum for further processing.

6 Claims, 5 Drawing Sheets

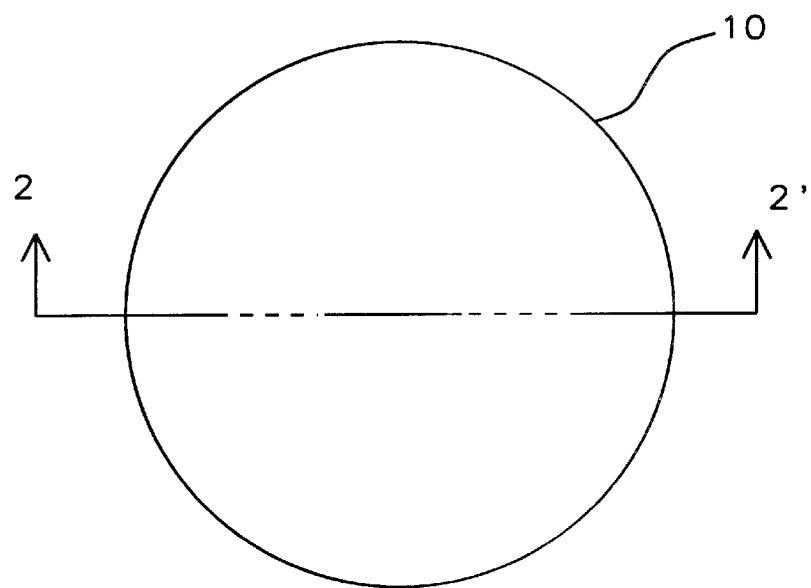
FIG. 1 – Prior Art
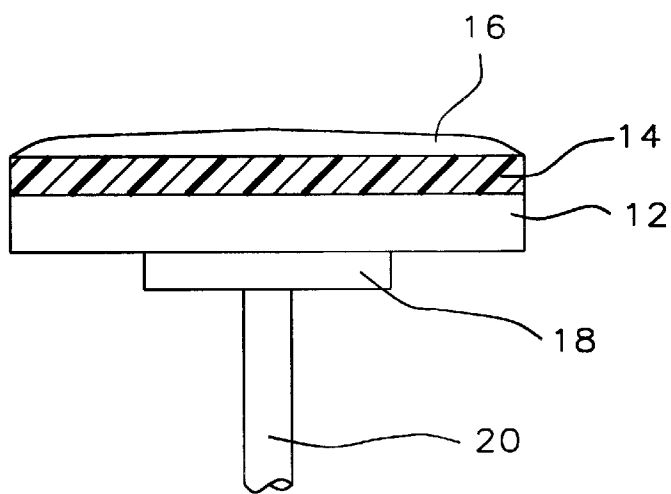
FIG. 2 – Prior Art

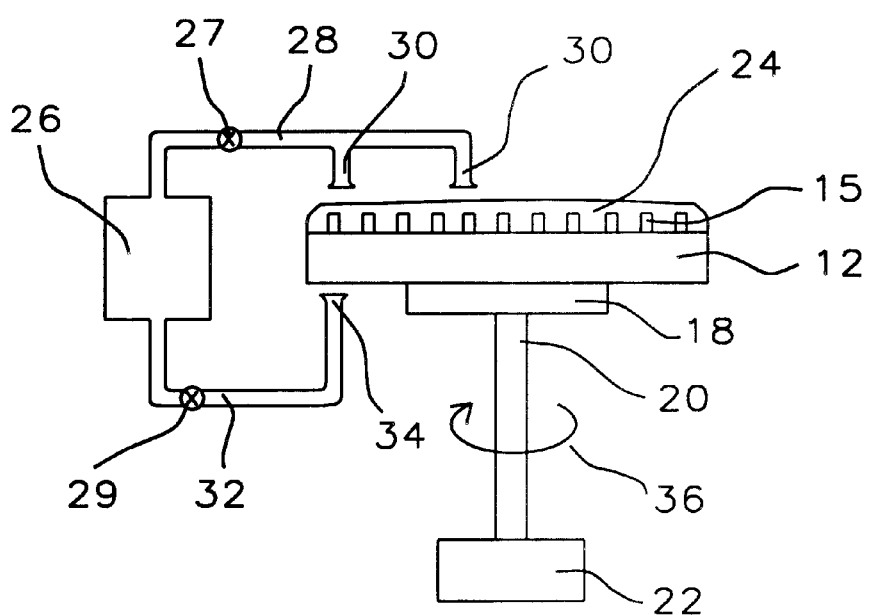
FIG. 3 – Prior Art

METHOD AND APPARATUS FOR IMPROVING RESIST PATTERN DEVELOPING

This is a division of patent application Ser. No. 08/827, 815, filing date Apr. 11, 1997, now U.S. Pat. No. 6,355,397 B1 to Chiu, Method And Apparatus For Improving Resist Pattern Development, assigned to the same assignee as the present invention.

BACKGROUND OF THE INVENTION (1) Field of the Invention

This invention is related to the developing of a selectively exposed layer of resist formed on an integrated circuit wafer and more particularly to stopping the developing process and removing the resist using immersion in de-ionized water followed by a vacuum dry period. The vacuum dry period may also include heating the wafer using a heat lamp.

(2) Description of the Related Art

U.S. Pat. No. 4,902,608 to Lamb et al. and U.S. Pat. No. 5,025,280 to Lamb et al. describes a method and apparatus for immersing a selectively exposed layer of photoresist on a wafer first in a bath of developer and next in a bath of de-ionized water. While the wafer is in the de-ionized water it is slowly turned in the water. The wafer is then removed from the water and rapidly spun to spin dry the wafer and photoresist.

U.S. Pat. No. 4,982,215 to Matsuoka describes a developing process where a workpiece having a resist layer is immersed in a bath of developer at a first temperature. Electrical current between the workpiece and an electrode also immersed in the developer to monitor the progress of the developing process. When the developing process has been completed an additional amount of developer at a second temperature, lower than the first temperature, is added to the original developer as the withdrawl of the developer is begun. The progress of the development is thus retarded providing precision for the endpoint of the development process.

This invention describes a method and apparatus for developing a resist pattern that does not require spinning the wafer and does not require batches of developer at different temperatures.

SUMMARY OF THE INVENTION

Resist patterns are routinely used in the manufacture of integrated circuit wafers. These resist patterns are formed by selectively exposing a layer of resist, using photolithography or electron beam methods or the like, and developing the selectively exposed layer of resist to form the pattern. Developing the resist is carried out by placing the exposed resist in contact with liquid developer material for a certain time followed by washing the developer away with de-ionized water, or other cleaning liquid. The de-ionized water is then removed by drying the resist pattern.

As the level of integration of integrated circuits increases problems are encountered with the conventional method of developing resist patterns. Some of the problems encountered developing resist patterns will be described with reference to FIGS. 1–3. FIG. 1 shows the top view of an integrated circuit wafer with a layer of selectively exposed resist formed thereon and liquid developer material placed on the layer of selectively exposed resist 10. FIG. 2 shows a cross section view of the integrated circuit wafer of along the line 2–2' of FIG. 1. FIG. 2 shows the integrated circuit wafer 12 placed on a wafer holder 18. The layer of selectively exposed resist 14 is formed on the integrated circuit wafer 12. Liquid developer material 16 is placed on the layer of resist 14. The wafer holder 18 is attached to a shaft 20.

FIG. 3 shows a cross section view of the integrated circuit wafer after the developing of the exposed resist has been completed. The layer of resist has been developed forming a resist pattern 15. The shaft 20 attached to the wafer holder 18 is attached to a means 22 for spinning the shaft 20, wafer holder 18, integrated circuit wafer 12, and developed resist pattern 15 as indicated by the rotational arrow 36. As the spinning of the wafer begins, and is still at a low speed, valves 27 and 29 are opened and de-ionized water is fed from a de-ionized water supply 26 through a pipe 28 to nozzles 30 which spray de-ionized water on the developed resist pattern 15 forming a layer of deionized water 24 over the resist pattern. De-ionized water is also directed from the de-ionized water supply 26 through a pipe 32 to a nozzle 34 to spray de-ionized water on the back side of the wafer. The valves 27 and 29 are then closed stopping the supply of de-ionized water to the integrated circuit wafer. The wafer is then spun at high speed to dry the wafer, thereby removing any residual de-ionized water. In this conventional developing method the de-ionized water, or other cleaning liquid, imparts a force to the fine elements of the resist pattern as the wafer is spun at high speeds often damaging the resist pattern.

It is a principle objective of this invention to provide a method of developing and cleaning a layer of selectively exposed resist which will avoid damage to the developed resist pattern.

It is another principle objective of this invention to provide an apparatus for developing and cleaning a layer of selectively exposed resist which will avoid damage to the developed resist pattern.

These objectives are achieved by immersing the integrated circuit wafer with developer on the resist pattern in de-ionized water after developing the resist pattern has been completed. There is no spinning of the wafer however low levels of ultrasonic power may be used. The wafer is then removed from the de-ionized water and the chamber containing the wafer is evacuated, using a means such as a vacuum pump, to dry the wafer. Heat, using a means such as a heating lamp, may be applied to the wafer while the chamber is evacuated. During the developing process no force is exerted on the resist pattern by the cleaning liquid, damage to the pattern is avoided, and a wider choice of resists is available.

BRIEF DESCRIPTION OF THE DRAWINGS

FIG. 1 shows a top view of an integrated circuit wafer with a layer of selectively exposed resist and developer placed on the resist.

FIG. 2 shows a cross section view of an integrated circuit wafer with a layer of selectively exposed resist and developer is placed on the resist. The wafer is attached to a wafer holder and the wafer holder is attached to a shaft for spinning the wafer.

FIG. 3 shows a schematic cross section view of an apparatus for a conventional method of cleaning the developer from the developed layer of exposed resist using de-ionized water and spinning the wafer at high speeds.

DESCRIPTION OF THE PREFERRED EMBODIMENTS

Figure 4:
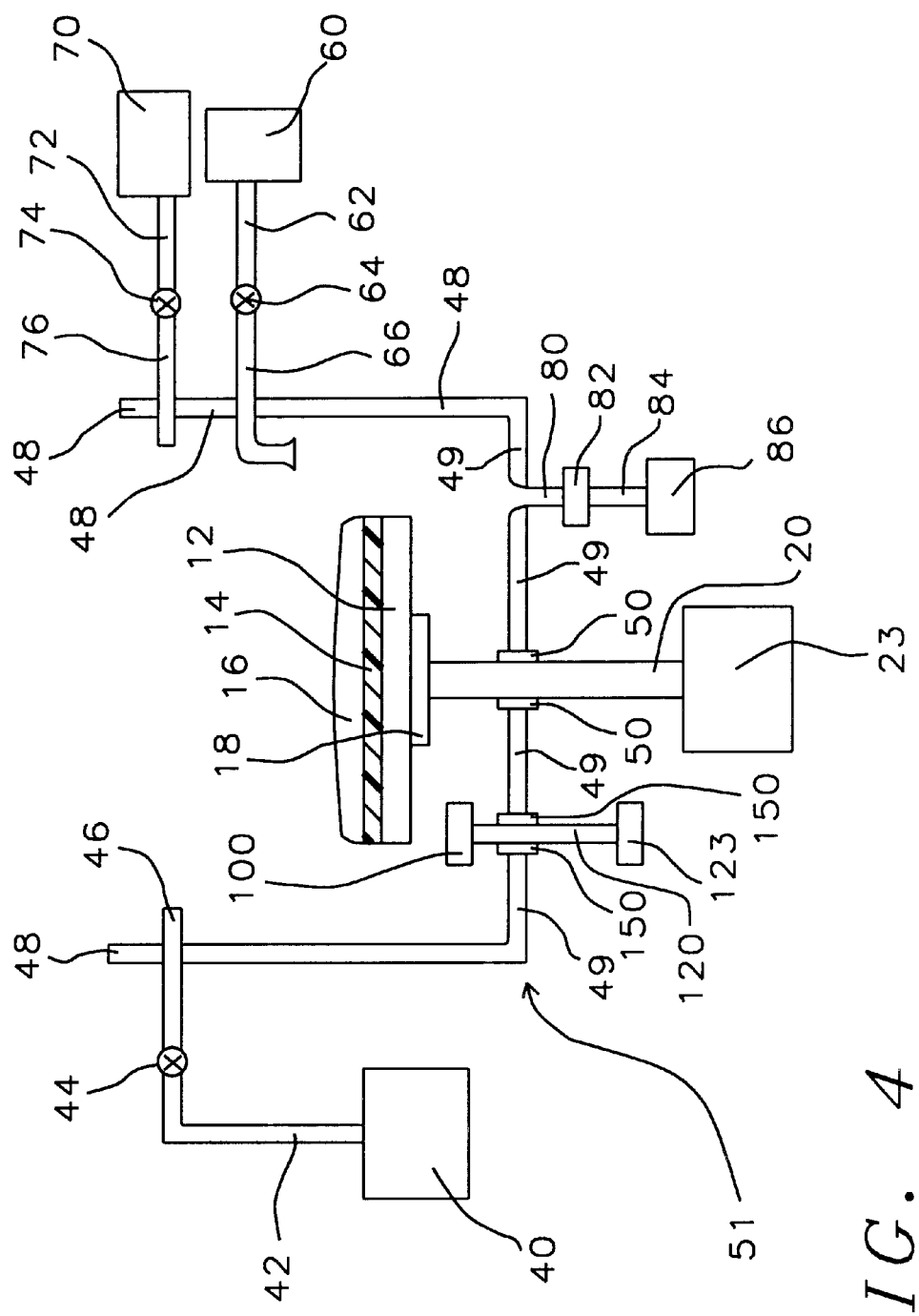
FIG. 4 shows a schematic cross section view of the apparatus and method of this invention showing the wafer placed in a chamber and developer placed on the selectively exposed layer of resist.
Figure 5:
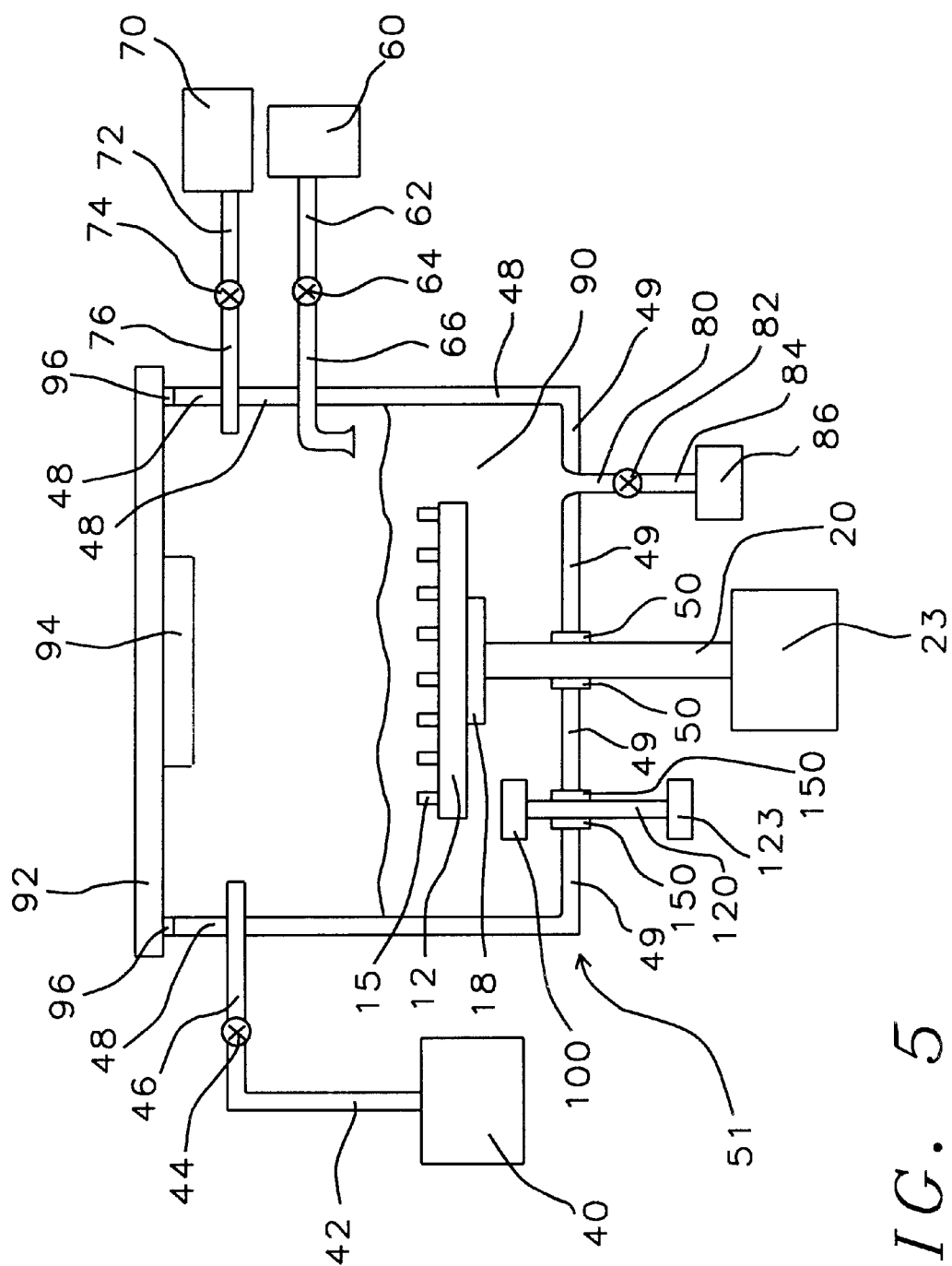
FIG. 5 shows a schematic cross section view of the apparatus and method of this invention showing the wafer placed in a sealed chamber and the wafer and the developed layer of resist immersed in de-ionized water.
Figure 6:
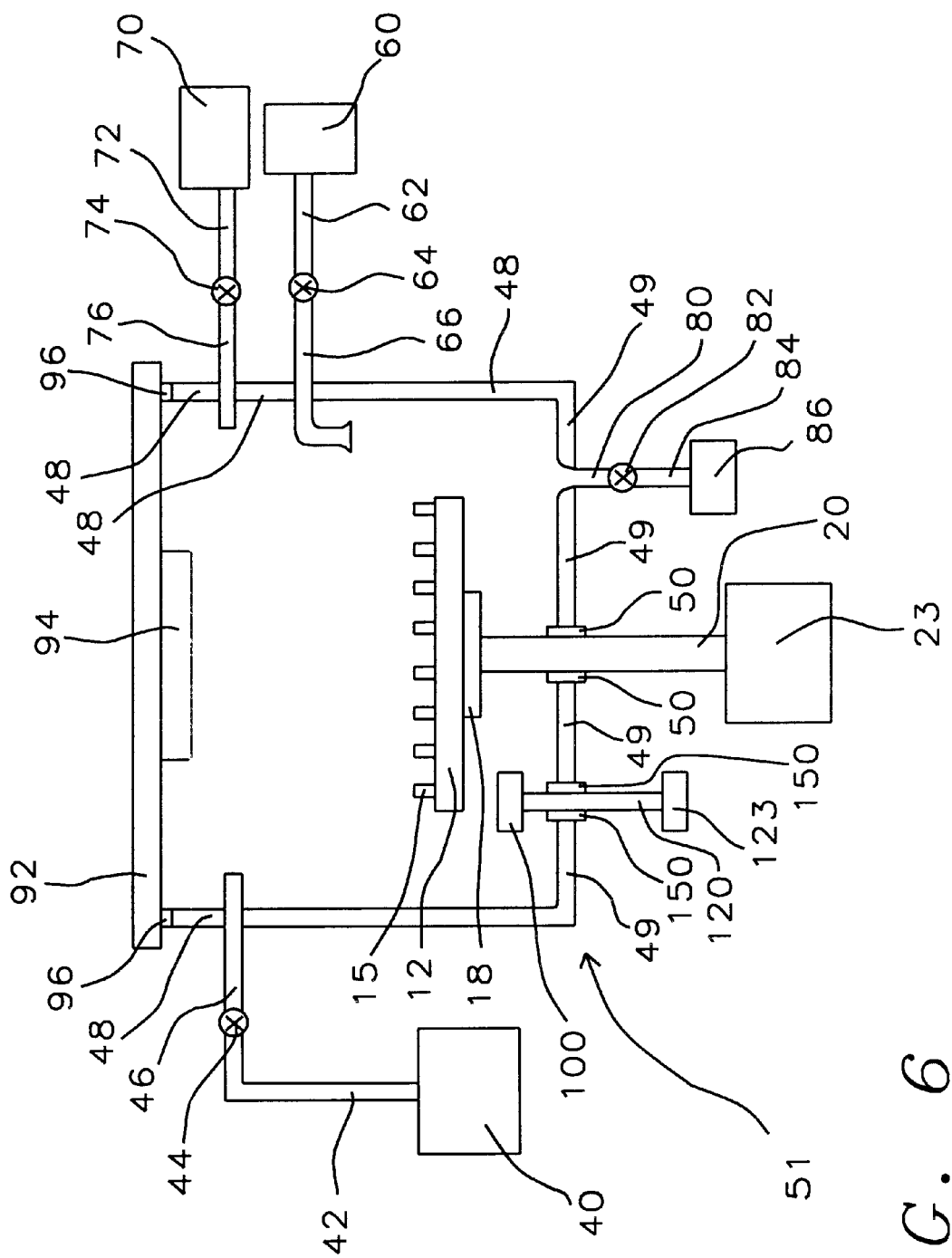
FIG. 6 shows a schematic cross section view of the apparatus and method of this invention showing the wafer placed in a sealed and evacuated chamber after the de-ionized water has been removed from the chamber.

The apparatus of this invention used for developing a selectively exposed layer of photoresist will now be described in detail with reference to FIGS. 4–6 which show a cross section view of the apparatus. Like reference numbers are used for like components in FIGS. 4–6. As shown in FIGS. 4–6 a first end of a first shaft 20 passes through a vacuum tight seal 50 in the bottom 49 of a chamber 51 and is attached to a wafer holder 18 inside the chamber 51. The second end of the first shaft 20 is attached to a means 23 for delivering ultrasonic power to the wafer holder 18. The integrated circuit wafer 12 is attached to the wafer holder 18. The chamber 51 is formed of a material such as quartz or metal with a coating to prevent metal contamination.

A first vacuum tube 46 passes through a port in the sidewall 48 of the chamber 51 and is connected to a vacuum valve 44. A second vacuum tube 42 is connected between a vacuum pump 40 and a the vacuum valve 44 so that the vacuum pump 40 can evacuate the chamber. A first exhaust tube 76 passes through a port in the sidewall 48 of the chamber 51 to an exhaust valve 74. A second exhaust tube 72 connects the exhaust valve 74 to an exhaust reservoir 70 for collecting and disposing of exhaust gasses. A first liquid tube 66 passes through a port in the sidewall 48 of the chamber 51 to a liquid valve 64. A second liquid tube 62 connects the liquid valve 64 to a cleaning liquid supply 60, such as a de-ionized water supply. A first drain tube 80 passes through a port in the bottom 49 of the chamber 51 to a drain valve 82. A second drain tube 84 connects the drain valve 82 to a drain reservoir 86 for collecting and disposing of liquids drained from the chamber 51.

As shown in FIGS. 5 and 6, a removable top 92 is placed on the chamber 51 and a vacuum gasket 96 provides a vacuum seal between the sidewalls 48 of the chamber and the removable top 92. A heating element 94, such as a heating lamp, is attached to the removable top 92 and can provide heat energy to the integrated circuit wafer 12. As shown in FIG. 5, de-ionized water 90 delivered from the de-ionized water source 60 through the second liquid tube 62, the liquid valve 64, and the first liquid tube 66 can fill the chamber 51 to a sufficient height to immerse the integrated circuit wafer 12 in de-ionized water. The first drain tube 80, the drain valve 82, and the second drain tube 84 can drain the de-ionized water from the chamber 51 to the liquid reservoir 86, as shown in FIG. 6. The first end of an optional second shaft 120 can be connected to a means 123 to deliver ultrasonic power directly to the cleaning liquid. The second end of the second shaft 120 then passes through a vacuum seal 150 in the bottom 49 of the chamber and is connected to a transducer 100 in the cleaning liquid.

Refer now to FIGS. 4–6 for a description of the preferred embodiment of the method of this invention for developing and cleaning a selectively exposed layer of resist. As shown in FIG. 4 an integrated circuit wafer 12, having devices formed therein and a selectively exposed layer of resist 14 formed thereon, is placed on a wafer holder 18 in the chamber 51. The layer of resist 14 can be photoresist selectively exposed using photolithographic methods, resist selectively exposed using electron beam methods, or the like. Developer 16 is placed on the layer of selectively exposed resist 14 to begin the developing process. As shown in FIG. 5, the top 92 of the chamber is then placed on the sidewalls 48 of the chamber and the vacuum gasket 96 seals the top 92 to the sidewalls 48.

After the developer has been in contact with the selectively exposed layer of resist for a first time, between about 0.5 and 2.0 minutes, a resist pattern 15 is formed from the selectively exposed layer of resist. The vacuum valve 44 and the drain valve 82 are closed. The exhaust valve 74 is opened, allowing gas to escape from the chamber through the first exhaust tube 76 and the second exhaust tube 72 to the exhaust reservoir 70, and the liquid valve 64 is opened, allowing de-ionized water from the de-ionized water supply 60 to flow through the second liquid tube 64 and the first liquid tube 66 into the chamber until the resist pattern 15 is immersed in de-ionized water 90, see FIG. 5.

During the time the resist pattern 15 is immersed in the de-ionized water a first ultrasonic power source 23, connected to a shaft 20 which is also connected to the wafer holder 18, can deliver ultrasonic power to the integrated circuit wafer 12 to aid in the removal of residual developer. As an optional alternative a second ultrasonic power source 123, connected to a shaft 120 which is also connected to a transducer 100 immersed in the de-ionized water 90, can deliver ultrasonic power to the de-ionized water 90 to aid in the removal of residual developer.

After the resist pattern 12 has been immersed in the de-ionized water for a second time the drain valve 82 is opened and the de-ionized water is drained through the first drain tube 80 and the second drain tube 84 into the drain reservoir 86, as shown in FIG. 6. The drain valve 82, the liquid valve 64, and the exhaust valve 76 are closed. The vacuum valve 44 is then opened and the vacuum pump 40 maintains a pressure in the chamber of about $1 \times 10^{-2}$ Torr or lower for between about 0.5 and 2.0 minutes. As an option the heat source 94, for example a heat lamp, can be used to elevate the temperature of the integrated circuit wafer 12 and resist pattern 15 to a temperature of between about 90° C. and 120° C. during the period the chamber is evacuated.

The vacuum valve 44 is then closed, the exhaust valve 74 is opened to equalize the pressure in the chamber, and the top 92 is removed from the chamber. The integrated circuit wafer 12 with the completed resist pattern 14 is then removed from the wafer holder 18 and the chamber 51 for further processing. During the developing process described there has been no force exerted on the resist pattern by the cleaning liquid and damage to the pattern is avoided.

This example has used a single cleaning liquid, in this example de-ionized water, to stop the developing process and clean the developer from the wafer. As an alternative other liquids or more than one cleaning liquid can be used. In this embodiment the integrated circuit wafer 12 and resist pattern 14 are first immersed in a first cleaning liquid, for example a surface agent such as de-ionized water. The first liquid is then drained and the integrated circuit wafer 12 and resist pattern 14 are immersed in a second cleaning liquid, for example de-ionized water. The second cleaning liquid is then drained and the embodiment proceeds as in the preceding embodiment after the de-ionized water has been drained.

While the invention has been particularly shown and described with reference to the preferred embodiments thereof, it will be understood by those skilled in the art that various changes in form and details may be made without departing from the spirit and scope of the invention.

What is claimed is:

1. An apparatus for forming resist patterns, comprising:
    a chamber having sidewalls, a bottom, and an open top;
    a chamber cover which can be placed on said open top of said chamber thereby sealing said chamber;
    a heating element attached to said chamber cover wherein said heating element is inside said chamber when said chamber cover is placed on said open top of said chamber;
    an integrated circuit holder extending through a vacuum seal in the bottom of said chamber into the interior of said chamber;
    means for placing cleaning liquid into said chamber;
    means for removing said cleaning liquid from said chamber; and
    means for evacuating said sealed chamber to a pressure of about $1 \times 10^{-2}$ Torr or less.

2. The apparatus of claim 1 further comprising means for supplying ultrasonic power to said integrated circuit holder.

3. The apparatus of claim 1 further comprising means for supplying ultrasonic power to said cleaning liquid when said cleaning liquid is placed in said chamber.

4. The apparatus of claim 1 wherein said means for evacuating said sealed chamber to a pressure of about $1 \times 10^{-2}$ Torr or less is a vacuum pump.

5. The apparatus of claim 1 wherein said cleaning liquid is de-ionized water.

6. The apparatus of claim 1 wherein said heating element is a heating lamp.

* * * * *